United States Patent
Eicher et al.

(10) Patent No.: US 10,632,655 B2
(45) Date of Patent: Apr. 28, 2020

(54) CARRIER SUBSTRATE FOR AN OPTOELECTRONIC SEMICONDUCTOR COMPONENT

(71) Applicant: OSRAM Opto Semiconductors GmbH, Regensburg (DE)

(72) Inventors: Stephan Eicher, Arnstorf (DE); Martin Brandl, Kelheim (DE); Markus Boss, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/752,455

(22) PCT Filed: Aug. 11, 2016

(86) PCT No.: PCT/EP2016/069171
§ 371 (c)(1),
(2) Date: Feb. 13, 2018

(87) PCT Pub. No.: WO2017/029197
PCT Pub. Date: Feb. 23, 2017

(65) Prior Publication Data
US 2019/0009441 A1      Jan. 10, 2019

(30) Foreign Application Priority Data
Aug. 14, 2015   (DE) .................. 10 2015 113 438

(51) Int. Cl.
*B29C 45/14*    (2006.01)
*H01L 33/48*    (2010.01)
*H01L 23/00*    (2006.01)

(52) U.S. Cl.
CPC ........ *B29C 45/14655* (2013.01); *H01L 24/97* (2013.01); *H01L 33/486* (2013.01);
(Continued)

(58) Field of Classification Search
CPC . H01L 51/56; H01L 51/5092; H01L 51/5056; H01L 51/5072; H01L 51/5221
(Continued)

(56) References Cited

U.S. PATENT DOCUMENTS 5,368,805 A * 11/1994 Motai ............... B29C 45/14655
257/E21.504
2003/0234446 A1* 12/2003 Diot ...................... H01L 21/565
257/694
(Continued)

FOREIGN PATENT DOCUMENTS

DE     10 2007 039 230 A1    3/2008
DE     10 2011 018 921 A1    10/2012
(Continued)

*Primary Examiner* — Andy Huynh
(74) *Attorney, Agent, or Firm* — DLA Piper LLP (US)

(57) ABSTRACT

A method of producing a carrier substrate for an optoelectronic semiconductor component includes: providing a leadframe including a first electrically conductive contact section and a second electrically conductive contact section, and injection molding a housing including a housing frame embedding the leadframe by an injection-molding material free of epoxy such that the leadframe embedded in the housing frame of the injection-molded housing forms a carrier substrate for an optoelectronic semiconductor component.

16 Claims, 9 Drawing Sheets

(52) U.S. Cl.
CPC ............... *H01L 2224/48091* (2013.01); *H01L 2224/48247* (2013.01); *H01L 2224/48257* (2013.01); *H01L 2924/12041* (2013.01); *H01L 2933/0033* (2013.01)

(58) Field of Classification Search
USPC .......................................................... 257/79
See application file for complete search history.

(56) References Cited

U.S. PATENT DOCUMENTS

| | | | |
|---|---|---|---|
| 2006/0267162 A1* | 11/2006 | Kunie | H01L 21/561 257/666 |
| 2010/0193815 A1 | 8/2010 | Jaeger et al. | |
| 2012/0025361 A1* | 2/2012 | Ito | H01L 23/047 257/676 |
| 2014/0117396 A1* | 5/2014 | Eisert | H01L 33/44 257/98 |
| 2015/0034975 A1* | 2/2015 | Rudmann | H01L 27/14625 257/82 |

FOREIGN PATENT DOCUMENTS

| | | |
|---|---|---|
| EP | 2 709 178 A2 | 3/2014 |
| EP | 2 750 212 A1 | 7/2014 |
| WO | 2014/033150 A1 | 3/2014 |

\* cited by examiner

CARRIER SUBSTRATE FOR AN OPTOELECTRONIC SEMICONDUCTOR COMPONENT

TECHNICAL FIELD

This disclosure relates to a method of producing a carrier substrate for an optoelectronic semiconductor component, a carrier substrate for an optoelectronic semiconductor component as well as an optoelectronic lighting device.

BACKGROUND

Optoelectronic semiconductor components are usually arranged on a leadframe for the purpose of electrical contacting. The leadframe may be potted with an epoxy, for example. This potting may comprise an extrusion, for example.

This type of potting is known by the designation "Foil Assisted Molding."

Such potting processes thus require a so-called "mold foil," a so-called "potting foil." Such foils are expensive.

It could therefore be helpful to provide an efficient concept to efficiently produce a carrier substrate for an optoelectronic semiconductor component, an improved carrier substrate for an optoelectronic semiconductor component and an improved optoelectronic lighting device.

SUMMARY

We provide a method of producing a carrier substrate for an optoelectronic semiconductor component including providing a leadframe including a first electrically conductive contact section and a second electrically conductive contact section, and injection molding a housing including a housing frame embedding the leadframe by an injection-molding material free of epoxy such that the leadframe embedded in the housing frame of the injection-molded housing forms a carrier substrate for an optoelectronic semiconductor component.

We also provide a carrier substrate for an optoelectronic semiconductor component including a leadframe including a first electrically conductive contact section and a second electrically conductive contact section, and a housing including a housing frame in which the leadframe is embedded, wherein the housing is configured as a housing that is injection-molded from an injection-molding material, and the injection-molding material is free of epoxy.

We further provide an optoelectronic lighting device including the carrier substrate for an optoelectronic semiconductor component including a leadframe including a first electrically conductive contact section and a second electrically conductive contact section, and a housing including a housing frame in which the leadframe is embedded, wherein the housing is configured as a housing that is injection-molded from an injection-molding material, and the injection-molding material is free of epoxy, and an optoelectronic semiconductor component arranged on one of either the first electrical contact section or the second electrical contact section, wherein an electrical connection is formed between the optoelectronic semiconductor component and the other of either the first electrical contact section and the second electrical contact section.

LIST OF REFERENCE SIGNS

Figure 1:
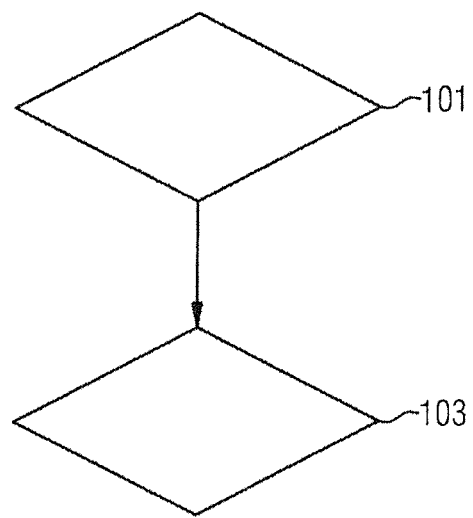
FIG. 1 shows a flow diagram of a method of producing a carrier substrate for an optoelectronic semiconductor component.

101 Providing
103 Injection molding
201 Carrier substrate
203 Leadframe
205 Sub-leadframes
207 first electrically conductive contact section
209 second electrically conductive contact section
211 Beam section
213 Transverse strut
215 Connection section
217 Injection perforation
219 Housing
221 Housing frame
223 Housing sub-frame
225 Anchoring section
301 Injection-molding mold
303 Mold lower part
305 Mold upper part
307 Cavity
309 Heating element
311 Cooling channel
601 Leadframe
603 Width
605 Length
701 Leadframe
703 Sub-leadframes
801 Carrier substrate
901 Cavity
903 Housing frame section
905 Top side of a sub-leadframe
1001 Optoelectronic lighting device
1003 Optoelectronic semiconductor component
1005 Bond wire
1007 Top side of the semiconductor component
1009 Underside of the semiconductor component
1011 Top side of the electrical contact sections
1013 Underside of the electrical contact sections
1101 Optoelectronic lighting device
1103 Optoelectronic semiconductor component

DETAILED DESCRIPTION

We provide a method of producing a carrier substrate for an optoelectronic semiconductor component comprising:
    providing a leadframe comprising a first electrically conductive contact section and a second electrically conductive contact section, and
    injection molding a housing comprising a housing frame embedding the leadframe, by an injection-molding material that is free of epoxy such that the leadframe embedded in the housing frame of the injection-molded housing forms a carrier substrate for an optoelectronic semiconductor component.

We also provide a carrier substrate for an optoelectronic semiconductor component comprising:
- a leadframe comprising a first electrically conductive contact section and a second electrically conductive contact section, and
- a housing comprising a housing frame, in which the leadframe is embedded,
- wherein the housing is configured as a housing that is injection-molded from an injection-molding material, wherein the injection-molding material is free of epoxy.

We further provide an optoelectronic lighting device comprising:
- the carrier substrate, and
- an optoelectronic semiconductor component arranged on one of either the first electrical contact section or the second electrical contact section, wherein an electrical connection is formed between the optoelectronic semiconductor component and the other of either the first electrical contact section and the second electrical contact section.

We discovered the concept, in particular and inter alia, of injection molding a housing for a leadframe, wherein an injection-molding material used for the injection molding is free of an epoxy. This affords the technical advantage, in particular, that after the injection molding, for example, the leadframe no longer need be freed of epoxy residues in a complex manner, with the result that the injection-molded housing may remain impermeable. In other words, negative influences on the impermeability of the housing on account of epoxy residue cleaning methods are avoided. For an epoxy residue cleaning method may customarily result in a molded housing becoming permeable.

Furthermore, an injection-molding process does not require any expensive mold foil such as was described above in the introductory part of the description in connection with "Foil Assisted Molding." As a result, costs, in particular, may thus be saved.

Furthermore, injection-molding materials that are significantly more favorable than epoxy may be used for the injection molding. Consequently, costs may be saved compared to "Foil Assisted Molding."

Furthermore, an injection-molding process may be carried out with significantly lower manufacturing tolerances compared to "Foil Assisted Molding." To compensate for manufacturing tolerances, so-called tolerance zones generally have to be provided in the context of "Foil Assisted Molding." These additional tolerance zones result in a larger component, that is to say a larger housing such that a ratio between a semiconductor component surface area and a total surface area of the carrier substrate (housing surface area and leadframe surface area) becomes unfavorable. That is to say that a comparatively large carrier substrate surface area is formed relative to the semiconductor component surface area. However, since such tolerance zones are not necessary in an injection-molding process, the ratio described above may be improved.

Furthermore, by the injection-molding process it is also possible to ensure that an initial reflectivity of a possible metal refining finish of the leadframe is maintained. An increase in the Rz (=Ra; averaged roughness of the surface) of a metal surface of the leadframe may often occur in a "Foil Assisted Molding" process.

The leadframe may comprise one or a plurality of injection perforations, in which injection-molding material is injected during the injection molding.

This affords the technical advantage, in particular, that the injection-molding material may be efficiently injected. Consequently, by way of example, an injection-molding mold may be efficiently filled with injection-molding material.

An injection perforation denotes a cutout extending from a top side of the leadframe to an underside of the leadframe, the underside being situated opposite the top side.

The leadframe may be subdivided into a plurality of sub-leadframes each comprising a first electrically conductive contact section and a second electrically conductive contact section such that, by the injection molding, the housing frame is formed with a plurality of sub-housing frames respectively embedding the plurality of sub-leadframes.

This affords the technical advantage, in particular, that a plurality of optoelectronic components may be efficiently electrically contacted at the leadframe. This is because owing to the provision of the sub-leadframes each comprising a first and a second electrically conductive contact section, optoelectronic semiconductor components may be arranged in each case on one of the two contact sections of a respective sub-leadframe. Furthermore, provision of such a leadframe structure comprising a plurality of sub-leadframes makes it possible to efficiently increase a number of injection perforations. In particular, a length of flow paths of the injection-molding material may be efficiently reduced. Complete filling of an injection-molding mold may be carried out efficiently as a result.

By the injection molding, the housing frame may be formed with a cavity, wherein the first contact section and the second contact section are arranged in a base region of the cavity.

This affords the technical advantage, in particular, that the section of the housing frame projecting above the first and second contact sections may act as a potting dam for a potting material used to preserve the optoelectronic semiconductor component. Such a potting dam advantageously prevents potting material from flowing away in the context of the potting process.

Injecting the injection-molding material may comprise vacuum injection.

This affords the technical advantage, in particular, that an injection-molding mold may be efficiently completely filled. This is the case in particular even if no or only relatively few injection perforations are provided in the leadframe.

The injection-molding material may be injected for a maximum of 1 s.

This affords the technical advantage, in particular, that an injection-molding mold may be efficiently completely filled. This is the case in particular even if no or only relatively few injection perforations are provided in the leadframe.

The injection-molding material may be injected for a maximum of 0.5 s, preferably for a maximum of 0.1 s.

Before injecting the injection-molding material, the leadframe and/or an injection-molding mold in which the leadframe is arranged may be respectively heated to a temperature greater than a temperature of the injected injection-molding material.

This affords the technical advantage, in particular, that the injected injection-molding material does not immediately solidify and no longer continue to flow upon contact with the injection-molding mold and/or respectively the leadframe. Efficient filling or efficient injection may advantageously be ensured as a result.

A closing force of an injection-molding mold in which the leadframe is arranged may be increased during a process of injecting the injection-molding material.

This affords the technical advantage, in particular, that an injected injection-molding material is distributed efficiently in the injection-molding mold. In particular, this affords the technical advantage that a stable injection-molding process may be realized as a result.

The injection-molding material may comprise a thermoplastic and/or a silicone.

Thermoplastics are cost-effective to produce and cost-effective to process. As a result, it is thus possible to afford the advantage that costs may be saved. In particular, the injection-molding process may be carried out efficiently owing to the use of a thermoplastic.

Particularly if the injection-molding material comprises a silicone, this affords the technical advantage, in particular, that the housing is particularly resistant to aging. The silicone may be a liquid silicone, for example.

A thermoplastic may be polyethylene terephthalate (PET), for example.

A thermoplastic may be polycyclohexylene dimethylene terephthalate (PCT), for example.

A thermoplastic may comprise both PET and PCT, for example.

Examples of the carrier substrate arise analogously from corresponding examples of the method, and vice-versa. That is to say that technical functionalities for the carrier substrate arise from corresponding technical functionalities for the method, and vice-versa.

The carrier substrate for an optoelectronic semiconductor component may be respectively produced by the method of producing a carrier substrate for an optoelectronic semiconductor component.

The optoelectronic semiconductor component may be a semiconductor chip.

The optoelectronic semiconductor component may be a light emitting diode (LED). In particular, the light emitting diode is an organic or an inorganic light emitting diode.

The light emitting diode is configured as a light emitting diode chip, for example.

The leadframe may comprise one or a plurality of injection perforations filled by injection-molding material.

The leadframe may be subdivided into a plurality of sub-leadframes each comprising a first electrically conductive contact section and a second electrically conductive contact section, wherein the housing frame comprises a plurality of sub-housing frames respectively embedding the plurality of sub-leadframes.

The housing frame may comprise a cavity, wherein the first contact section and the second contact section are arranged in a base region of the cavity.

The injection-molding material may comprise a thermoplastic and/or a silicone.

Injection molding comprises, for example, one or more of the following steps: opening an injection-molding mold, introducing the leadframe into the opened injection-molding mold, closing the injection-molding mold, introducing or injecting injection-molding material, allowing a predetermined time duration to elapse until the injection-molding material is solidified or cured sufficiently to remove the leadframe comprising the injection-molded housing from the injection-molding mold again, opening the injection-molding mold, removing the leadframe comprising the injection-molded housing.

The first electrically conductive contact section may be referred to, for example, as a leadframe section. The second electrically conductive contact section may be referred to, for example, as a second leadframe section.

The leadframe comprises copper, for example, or is formed from copper.

The first contact section and the second contact section may respectively be electrically insulated from one another. This is the case in particular after injection molding.

The first contact section and the second contact section may be respectively physically separated from one another. This is the case in particular after injection molding.

The above-described properties, features and advantages and the way in which they are achieved will become clearer and more clearly understood in association with the following description of examples explained in greater detail in association with the drawings.

Identical reference signs may be used for identical features hereinafter.

FIG. 1 shows a flow diagram of a method of producing a carrier substrate for an optoelectronic semiconductor component.

The method comprises the following steps:
providing 101 a leadframe comprising a first electrically conductive contact section and a second electrically conductive contact section, and
injection molding 103 a housing comprising a housing frame embedding the leadframe, by an injection-molding material free of epoxy such that the leadframe embedded in the housing frame of the injection-molded housing forms a carrier substrate for an optoelectronic semiconductor component.

Figure 2:
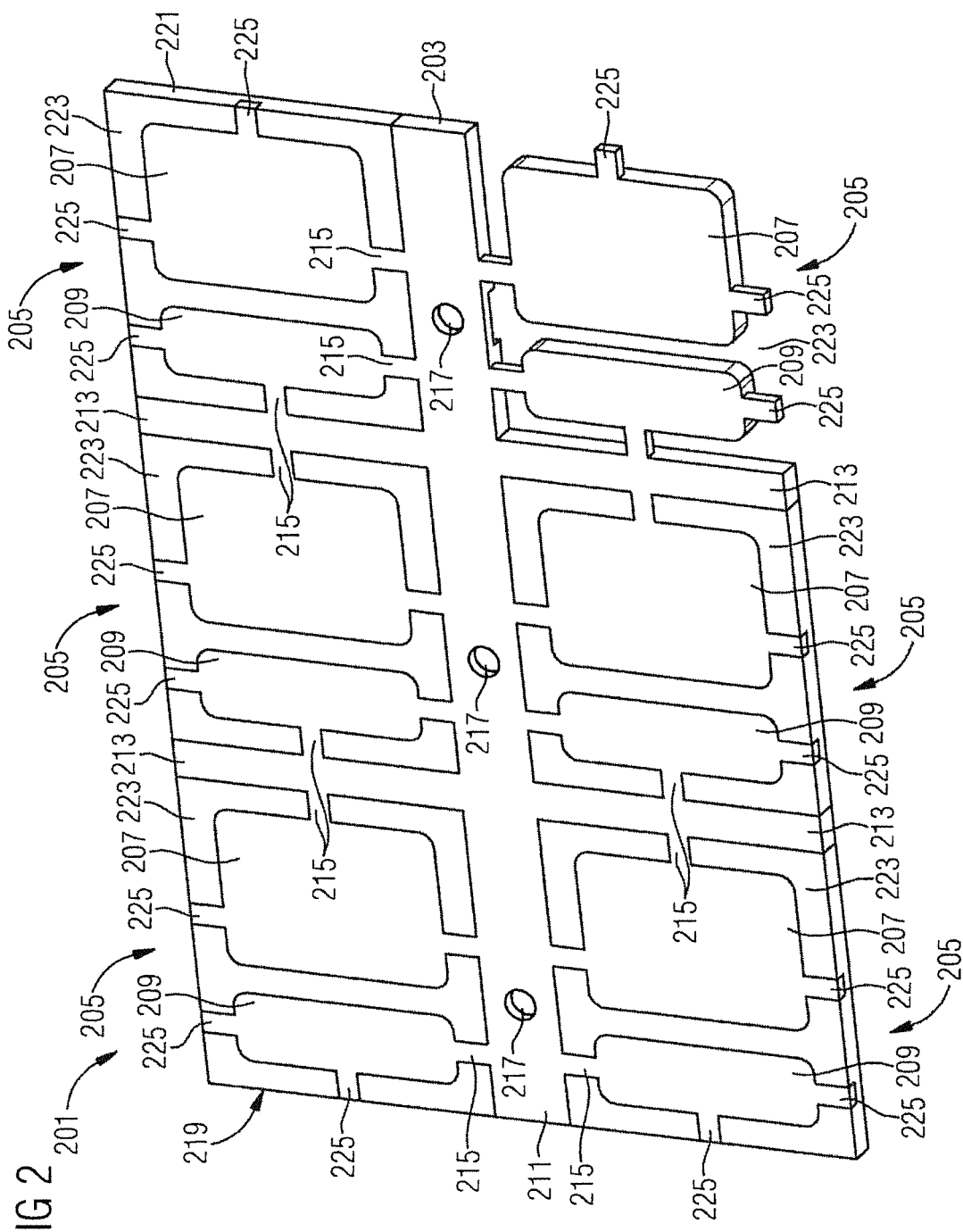
FIG. 2 shows a carrier substrate.

FIG. 2 shows a carrier substrate 201 in an oblique plan view from above.

The carrier substrate 201 comprises a leadframe 203. The leadframe 203 comprises copper, for example.

The leadframe 203 comprises a plurality of sub-leadframes 205, each configured identically. The sub-leadframes 205 each comprise a first electrically conductive contact section 207 and a second electrically conductive contact section 209.

The leadframe 203 comprises a central beam section 211 extending along an axis of symmetry of the leadframe 203. Each of two transverse struts 213 project on the left and right from the beam section 211 relative to the longitudinal axis thereof. On account of the central beam section 211 and the four transverse struts 213, the leadframe 203 is geometrically subdivided into six regions here formed by the sub-leadframes 205. That is to say that the first and second electrically conductive contact sections 207, 209 of the sub-leadframes 205 connect to the beam section 211 and/or respectively to the transverse struts 213. For this connection, the contact sections 207, 209 comprise connection sections 215.

That is to say that the contacts sections 207, 209, the beam section 211 and the transverse struts 213 are configured integrally as a common component. Consequently, the individual contact sections 207, 209 thus still electrically connect to one another, that is to say short-circuited with one another. Therefore, in a further example (not shown), the connection sections 215 are removed such that the first electrically conductive contact sections 207 and the second electrically conductive contact sections 209 are electrically insulated from one another and that they are thus also physically separated from one another.

The way in which such connection sections 215 are removed is known per se to those skilled in the art. By way of example, such connection sections 215 may be etched away.

The beam section 211 comprises three injection perforations 217. Injection-molding material was injected into the injection perforations 217 during an injection-molding process. This may afford the technical advantage, in particular, that efficient filling of an injection-molding mold may be effected. In an example not shown, provision may also be made of more or fewer than three injection perforations 217.

The carrier substrate 201 comprises an injection-molded housing 219. The housing 219 comprises a housing frame 221 that embeds the leadframe 203. The housing frame 221 comprises a plurality of housing sub-frames 223 each embedding one of the sub-leadframes 205.

The housing 219 is thus formed by an injection-molding process. In the context of such injection molding, the leadframe 203 is inserted into an injection-molding mold and an injection-molding material is subsequently injected. The injection-molding material is free of an epoxy. As a result of the injection molding, the housing 219 thus forms with a housing frame 221 comprising a plurality of housing sub-frames 223.

The first and second contact sections 207, 209 further comprise anchoring sections 225 that anchor the contact sections 207, 209 in the injection-molded housing frame 221. Efficient mechanical stability of the carrier substrate 201 is advantageously achieved as a result.

Figure 3:
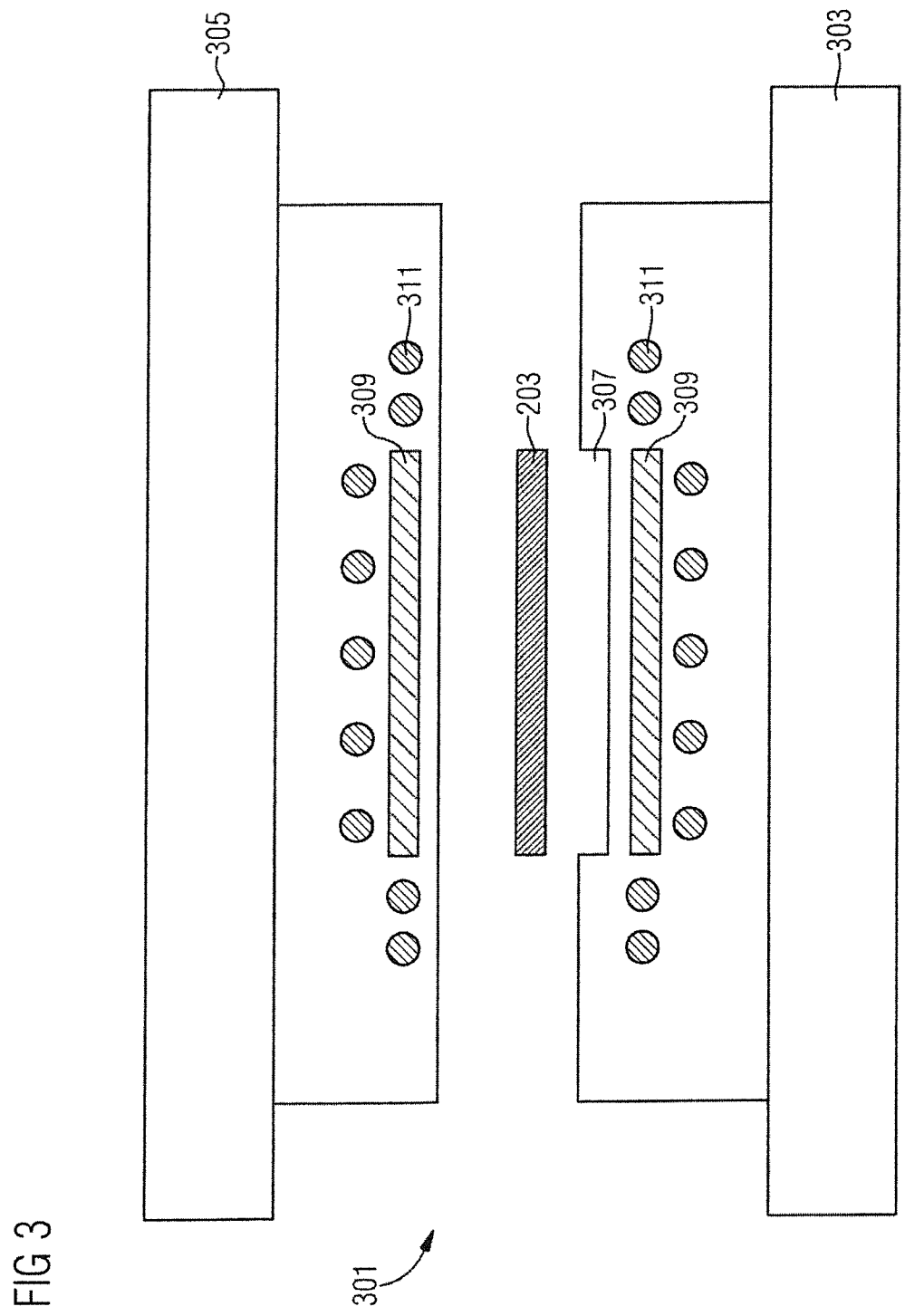
FIGS. 3 to 6 each show a step in a method of producing a carrier substrate for an optoelectronic semiconductor component.

FIG. 3 shows one step in a method of producing a carrier substrate for an optoelectronic semiconductor component.

The leadframe 203, still without the injection-molded housing 219, is inserted into an opened injection-molding mold 301. The injection-molding mold 301 comprises a mold lower part 303 and a mold upper part 305. The mold lower part 303 comprises an upwardly open cavity 307. The cavity 307 is closed by the mold upper part 305 in the closed state of the injection-molding mold 301.

The leadframe 203 is inserted into the cavity 307.

The mold lower part 303 and the mold upper part 305 each comprise one or a plurality of heating elements 309. The heating elements 309 may advantageously heat the mold lower part 303 and/or respectively the mold upper part 305. By way of example, the heating elements 309 may comprise ceramic heating elements. By way of example, the heating elements 309 may be configured as inductive heating elements. In other words, the heating elements 309 may be activated by an inductive excitation. By way of example, the heating elements 309 may comprise one or a plurality of coils. By a voltage being induced in the coils, an electric current then flows in the coils such that the coils may then be heated on account of ohmic losses of the electric current flowing in the coils.

The heating elements 309 are already activated when the injection-molding mold 301 is in the open state. Consequently, the heating elements 309 already heat the mold lower part 303 and the mold upper part 305 in the open state.

The mold lower part 303 and the mold upper part 305 each comprise a plurality of cooling channels 311. The cooling channels 311 are configured such that a coolant or refrigerant may flow through them. That is to say that a refrigerant or refrigerating fluid may flow through the cooling channels 311. A refrigerant is a refrigerating fluid, for example. By way of example, a cooling liquid or a cooling gas may be guided through the cooling channels 311. Consequently, cooling of the mold lower part 303 and the mold upper part 305 may advantageously be effected.

Activating the cooling channels 311 means that coolant flows through the channels 311. The cooling channels 311 are thus activated, that is to say effect cooling.

Conversely, deactivating the cooling channels 311 means that a refrigerant or coolant flow is stopped and/or respectively that the refrigerant is removed again from the cooling channels 311. A cooling function of the cooling channels is thus deactivated. The cooling channels 311 are thus deactivated, that is to say no longer effect cooling.

In the open state of the injection-molding mold 301, when the leadframe 203 is inserted into the cavity 207 and while the heating elements 309 are activated, the cooling channels 311 are deactivated. In other words, that no cooling takes place.

The mold lower part 303 and the mold upper part 305 are heated by the heating elements 309 to a temperature greater than a temperature of the injection-molding material yet to be injected. According to one example, the mold lower part 303 and the mold upper part 305 are heated by the heating elements 309 to a temperature greater than a glass transition temperature of the injection-molding material to be injected, which is a thermoplastic, for example.

By virtue of the fact that provision is made for heating the mold lower part 303 and the mold upper part 305 by the heating elements 309, the inserted leadframe 203 is also heated.

Figure 4:
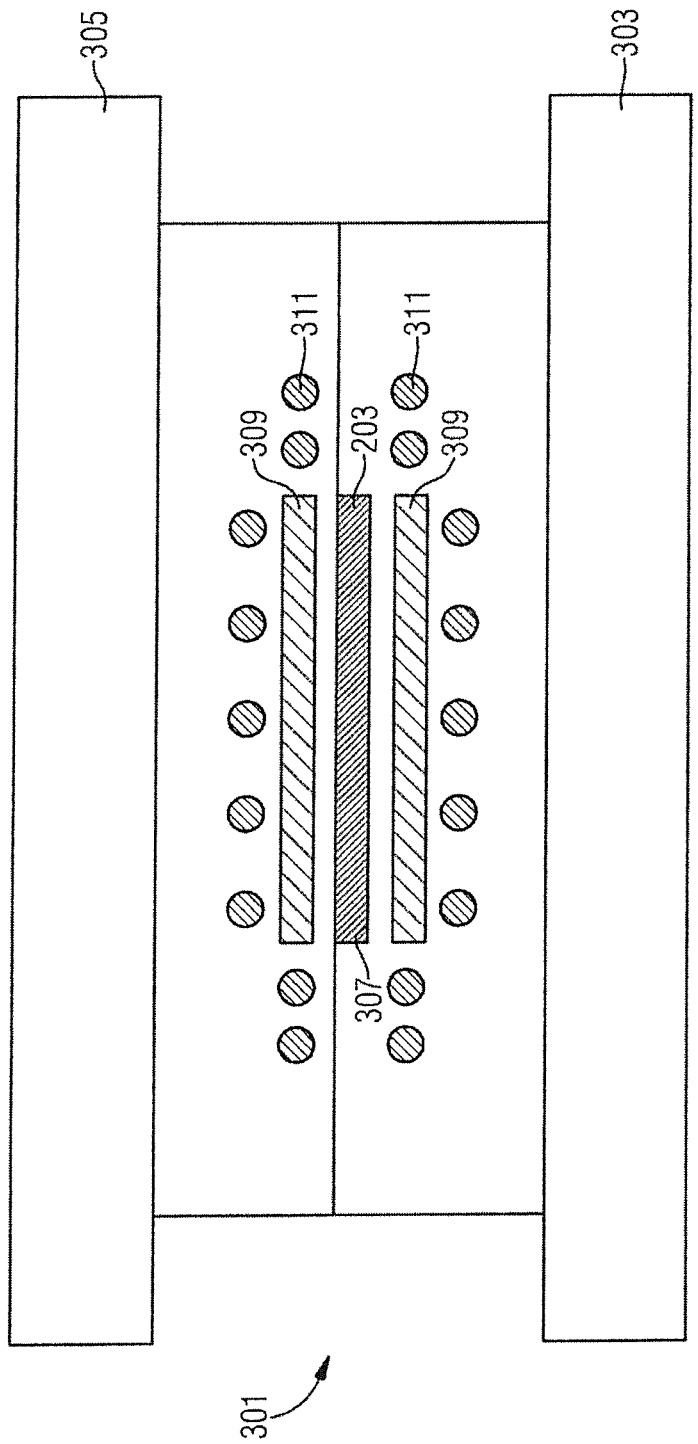

FIG. 4 shows a further step in a method of producing a carrier substrate for an optoelectronic semiconductor component. This step in accordance with FIG. 4 temporally succeeds the step in accordance with FIG. 3.

The injection-molding mold 301 has now been closed. The heating elements 309 still remain activated. The cooling channels 311 still remain deactivated.

Injection of an injection-molding material then takes place, which is not illustrated here for the sake of clarity. The injection-molding material is free of an epoxy. By way of example, the injection-molding material may be a thermoplastic or a silicone, in particular a liquid silicone. By way of example, the thermoplastic may be PET, PET/PCT or PCT.

Injection of the injection-molding material lasts, for example, for approximately 0.1 s, for a maximum of 0.5 s. The injection comprises vacuum injection, for example. In particular, a closing force of the injection-molding mold 301 comprises a predetermined value at the beginning of the injection, wherein the closing force is increased during the injection proceeding from the predetermined value.

Figure 5:
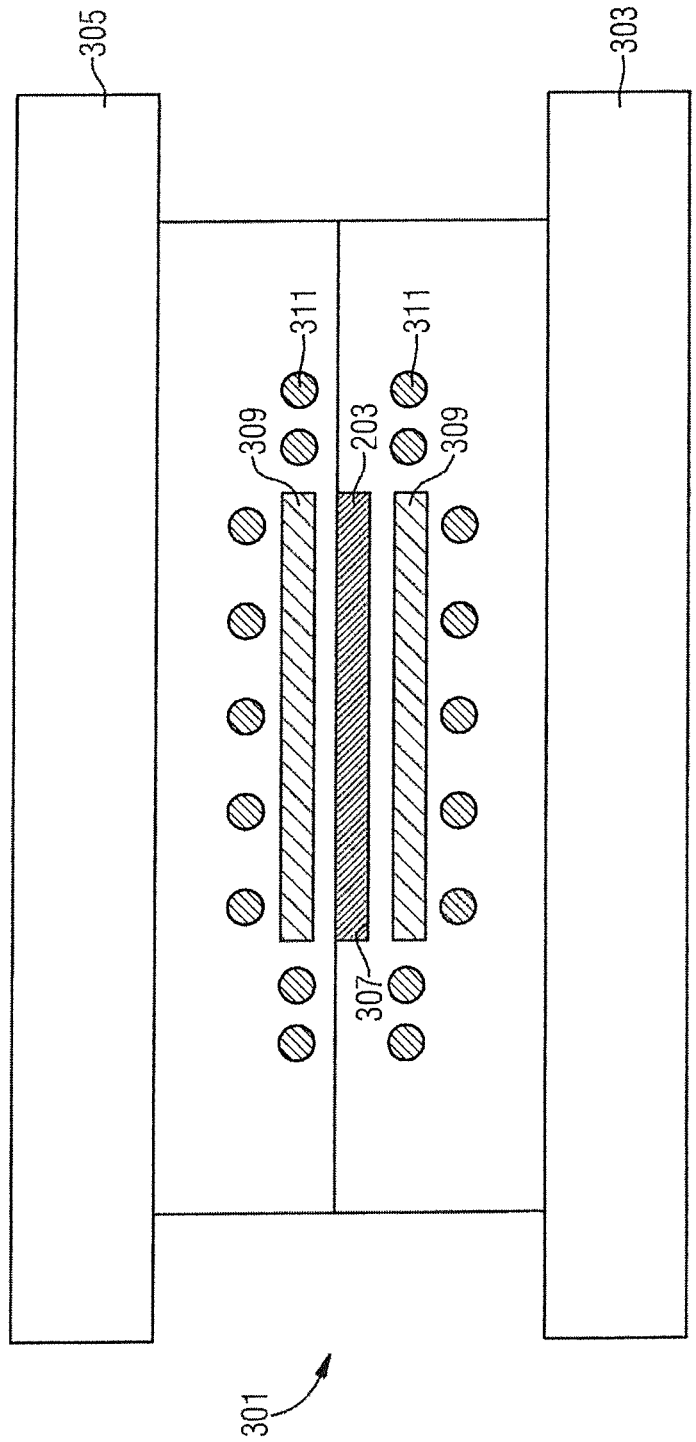

FIG. 5 shows a further step in a method of producing a carrier substrate for an optoelectronic semiconductor component. The step in accordance with FIG. 5 temporally succeeds the step in accordance with FIG. 4.

After injection of the injection-molding material, the heating elements 309 are deactivated. The cooling channels 311 are activated. By way of example, water or a supercritical gas, for example, $CO_2$ as refrigerant is passed through the cooling channels 311. The cooling channels 311 may act as an expansion volume for the refrigerant.

Waiting then occurs for a time duration sufficient to ensure that the injected injection-molding material is cured sufficiently to remove the leadframe 203 comprising the injection-molded housing from the cavity 307.

Figure 6:
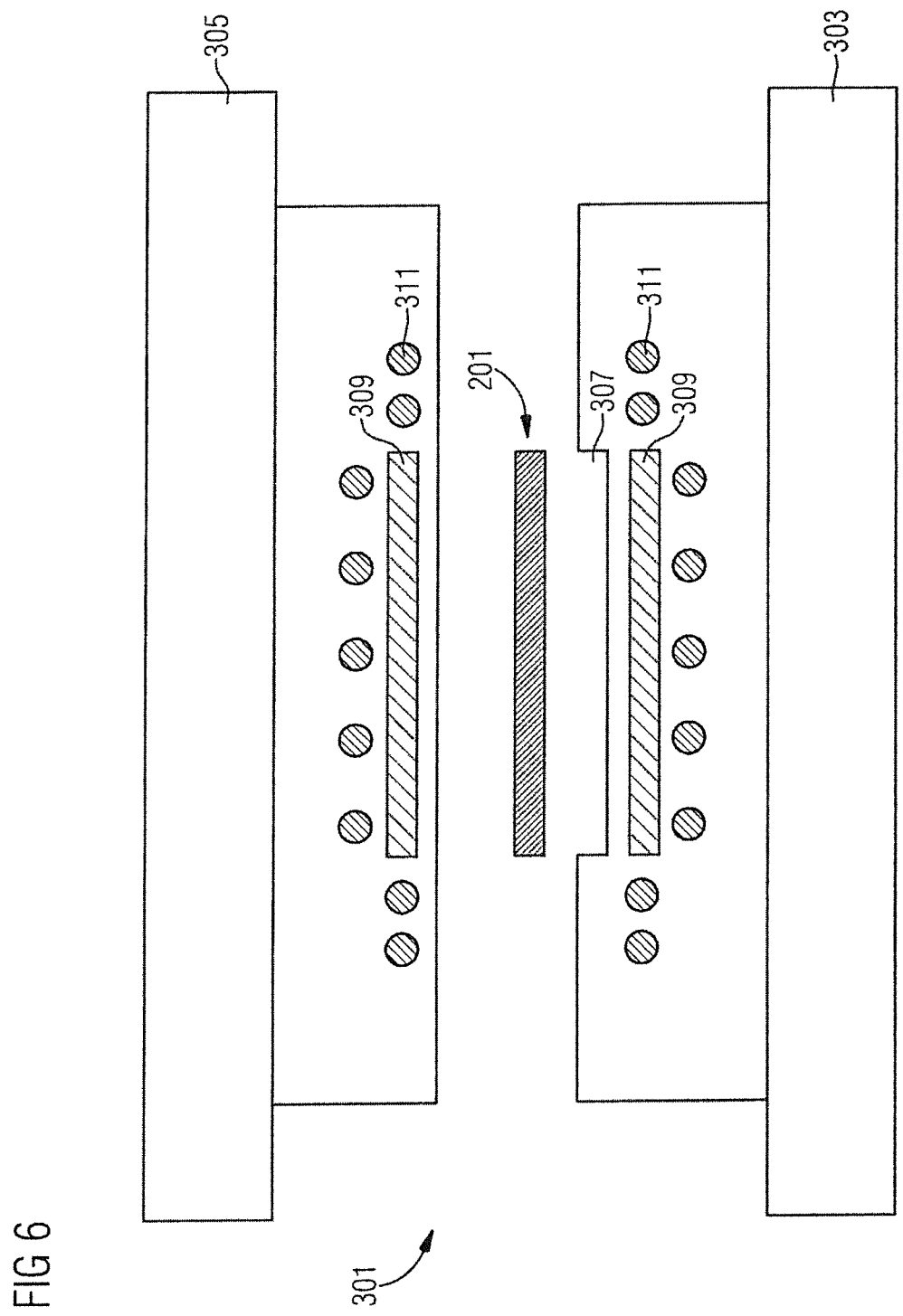

FIG. 6 shows a further step in a method of producing a carrier substrate for an optoelectronic semiconductor component. The step in accordance with FIG. 6 temporally succeeds the step in accordance with FIG. 5.

After sufficient curing of the injected injection-molding material, the cooling channels 311 are deactivated and the heating elements 309 activated. The injection-molding mold 301 is opened such that the leadframe 203 comprising the injection-molded housing 219 may then be removed from the injection-molding mold 301.

Afterward, a further leadframe 201 may be inserted into the cavity 207 and the injection molding begins again from the outset.

Figure 7:
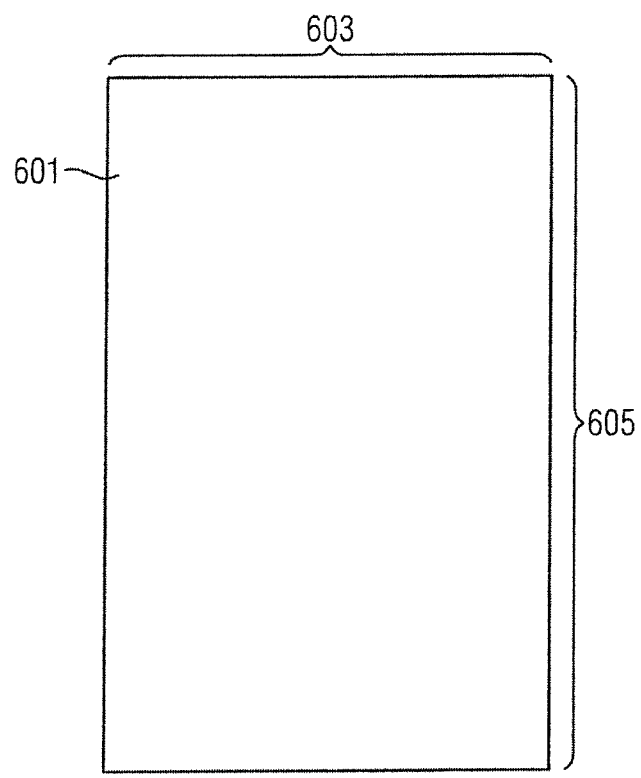
FIG. 7 shows a leadframe.

FIG. 7 shows a leadframe 601 in a schematic view from above.

The leadframe 601 comprises a width 603 and a length 605. By way of example, the width 603 may be 100 mm. By way of example, the length 605 may be 300 mm. The leadframe 601 thus comprises a specific area and/or respectively size.

The leadframe 601 comprises a first electrically conductive contact section and a second electrically conductive contact section not illustrated here for the sake of clarity. The illustration shown in FIG. 7 is merely intended to be a schematic illustration. The leadframe 601 may be configured, for example, like a sub-leadframe 205 in accordance with FIG. 2.

Figure 8:
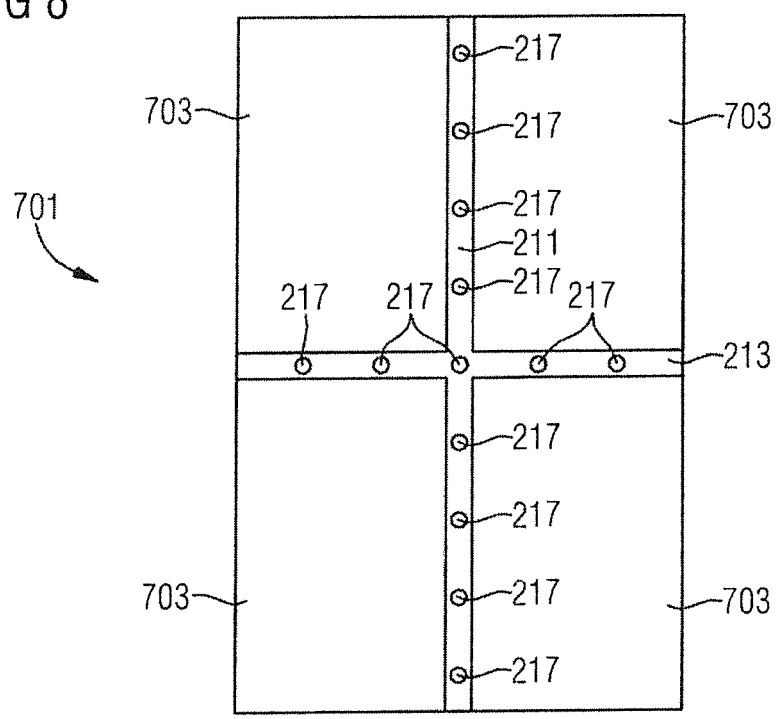
FIG. 8 shows a further leadframe.

To be able to carry out an injection-molding process or injection molding more efficiently, provision is made for a leadframe 701 in accordance with FIG. 8 to be used instead of the leadframe 601. The leadframe 701 in FIG. 8 comprises four sub-leadframes 703, wherein the four sub-leadframes 703 connect to one another via a beam section 211 and two transverse struts 213 analogously to the leadframe 203 in FIG. 2. The sub-leadframes 703 may be configured, for example, analogously to the sub-leadframes 205 in accordance with FIG. 2. The contact sections are not shown here either, for the sake of clarity.

The leadframe 701 is dimensioned such that it comprises a size or an area identical to that of the leadframe 601 in FIG. 7. However, in the leadframe 701 in FIG. 8, this leadframe is formed from four sub-leadframes 703. As a result, flow paths of an injected injection-molding material may advantageously be shortened such that an injection-molding process may be carried out efficiently.

Analogously to the leadframe 203 in FIG. 2, the leadframe 701 comprises a plurality of injection perforations 217 formed in the beam section 211 and in the transverse struts 213.

The leadframe 701 may then be inserted into the injection-molding mold 301, for example, to injection-mold a housing comprising a housing frame comprising a plurality of housing sub-frames.

Figure 9:
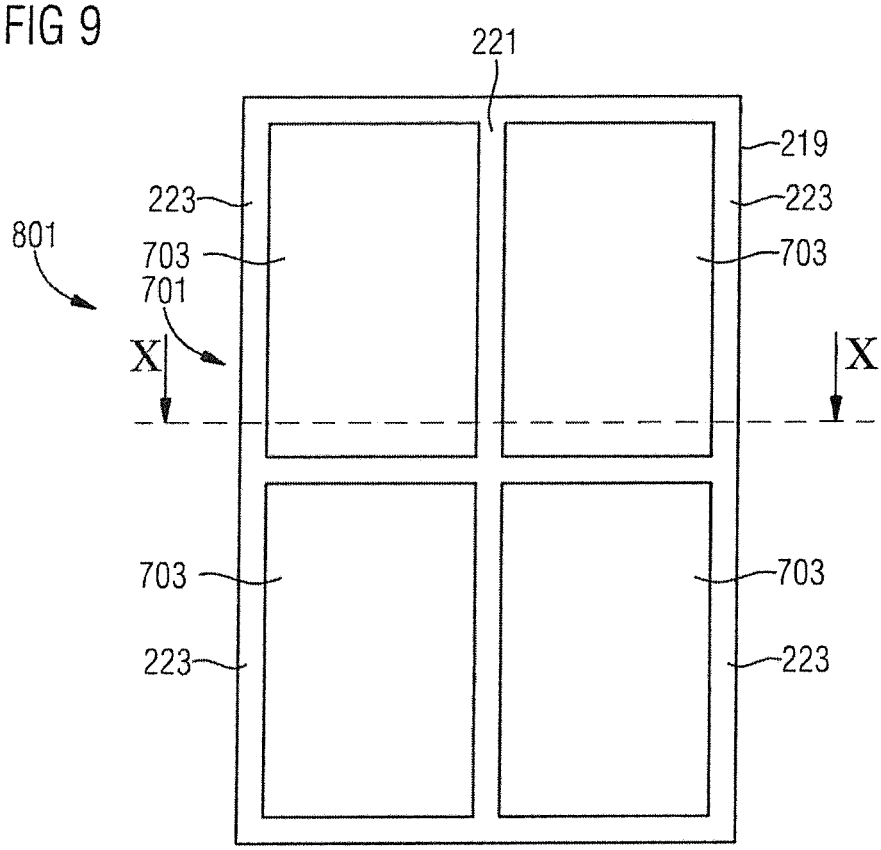
FIG. 9 shows a carrier substrate.

FIG. 9 shows a carrier substrate 801.

The carrier substrate 801 comprises the leadframe 701 from FIG. 8. The carrier substrate 801 furthermore comprises an injection-molded housing 219. The housing 219 comprises a housing frame 221 that embeds the leadframe 701. The housing frame 221 comprises four housing sub-frames 223 respectively embedding the sub-leadframes 703.

Figure 10:
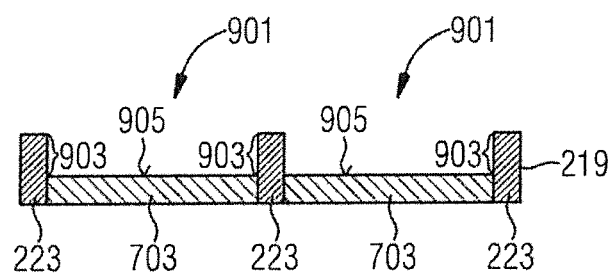
FIG. 10 shows a sectional view of the carrier substrate from FIG. 8.

During the injection molding, an adhesive dam was formed by the injected injection-molding material. This is shown illustratively in FIG. 10 that shows a lateral sectional view of the carrier substrate 801 from FIG. 9 along the dashed line A-A.

The housing sub-frame 223 comprises a housing frame section 903 projecting above a top side 905 of a sub-leadframe 703. A cavity 901 is thus formed in the base region of which the first and second electrically conductive sections are situated. The housing frame section 903 acts as a dam, in particular as an adhesive dam. In other words, when an optoelectronic semiconductor component is adhesively bonded onto the top side 905, an adhesive applied on the top side 905 may not flow down from the top side 905. An efficient adhesive bonding process may advantageously be carried out as a result.

Figure 11:
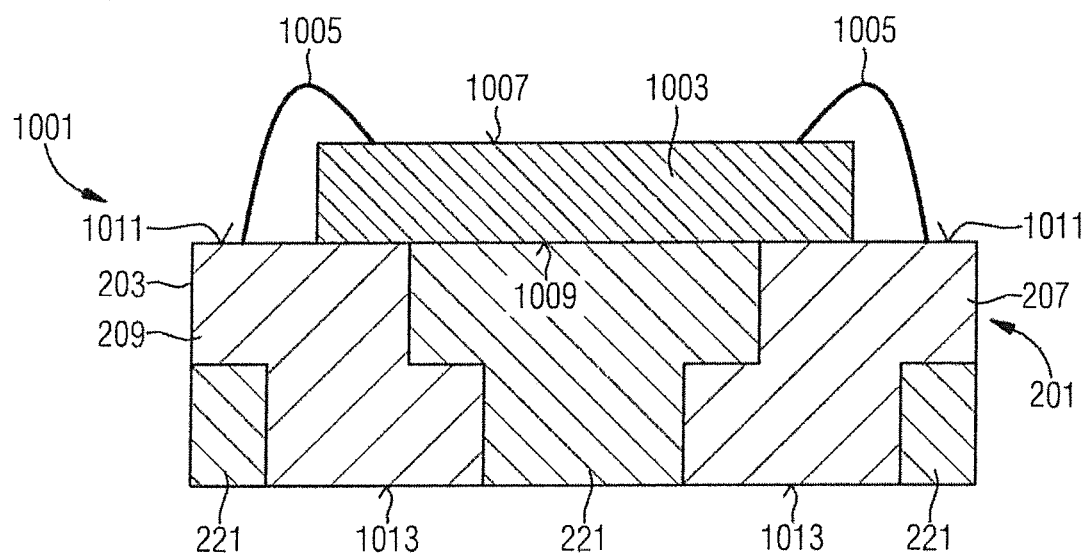
FIG. 11 shows an optoelectronic lighting device.

FIG. 11 shows an optoelectronic lighting device 1001.

The optoelectronic lighting device 1001 comprises the carrier substrate 201. The optoelectronic lighting device 1001 comprises an optoelectronic semiconductor component 1003 configured as a semiconductor chip. The semiconductor chip 1003 is configured such that an electrical contacting has to be effected by the top side 1007 of the semiconductor chip. The semiconductor chip 1003 is arranged by its underside 1009, situated opposite the top side 1007, on the top side 1011 of the electrical contact sections 209, 207. Bond wires 1005 are provided to electrically contact the contact sections 207, 209 with the top side 1007 of the semiconductor chip 1003.

The underside of the electrically conductive contact sections 207, 209 is provided with the reference sign 1013. This underside 1013 is arranged opposite the top side 1011.

The optoelectronic lighting device 1001 comprises an identical ratio of leadframe relative to injection-molding material on the top side 1011 and on the underside 1013.

Figure 12:
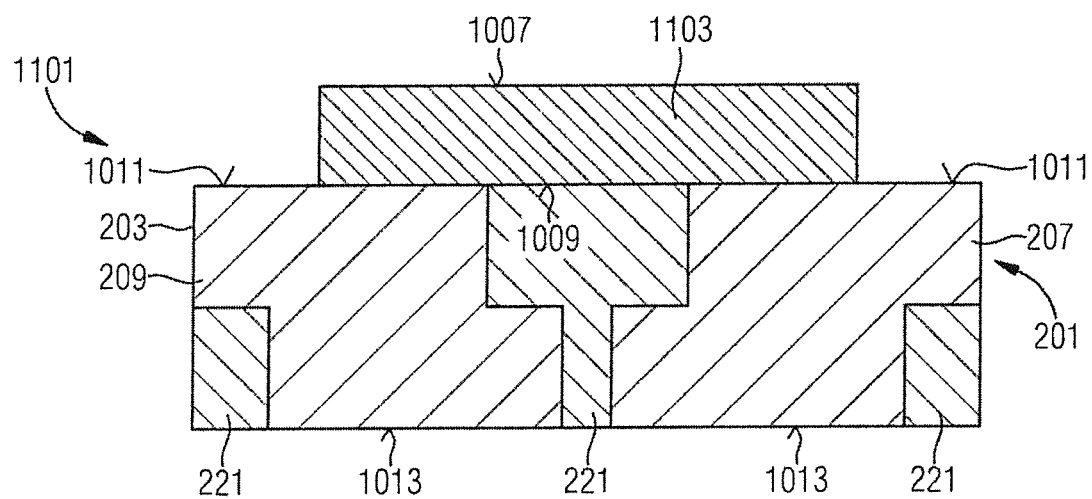
FIG. 12 shows a further optoelectronic lighting device.

FIG. 12 shows a further optoelectronic lighting device 1101.

The optoelectronic lighting device 1101 comprises the carrier substrate 201 and an optoelectronic semiconductor component 1103 configured as a semiconductor chip. The semiconductor component 1103 is configured as a so-called flip-chip. In other words, an electrical contacting has to be effected from the underside 1009 of the semiconductor component 1103. The flip-chip 1103 is thus arranged by its underside 1009 on the top side 1011 of the electrically conductive contact sections 207, 209.

An identical ratio of leadframe to injection-molding material both on the top side 1011 and the underside 1013 is provided in the optoelectronic lighting device 1101 as well.

We thus discovered the concept, in particular and inter alia, of producing so-called QFN maps on the basis of an injection-molding process. QFN stands for "quad flat no leads." According to one example, a component height of the QFN maps ("Surface potting") A QFN map is thus a surface-potted leadframe corresponding to a height of the metal substrate (the leadframe) used. Such a package may also be referred to as a flat mold package.

We use aging-resistant thermoplastics such as PET, PET/PCT or PCT. We also may use aging-resistant aging-resistant liquid silicone in a so-called LSR process. LSR means "Liquid Silicone Rubber" and denotes liquid silicones. The liquid silicones may be processed with specific attachments in an injection-molding process, highly filled silicones normally being processed by extrusion.

Thermoplastics such as PET or PCT are currently varying at a price level that is approximately 90% to 80% more favorable than that of white epoxy mold compound, that is to say an epoxy material. Consequently, the housing may be produced cost-effectively.

Furthermore, a minimum footprint may be produced by avoiding flash tolerance zones, which are necessary in so-called foil assisted molding, but are not necessary in injection molding. The footprint is the exterior dimensioning of the LED on the soldering side.

Flat mold packages may thus advantageously be produced without the need to carry out complex so-called deflashing processes. In foil assisted molding, deflashing processes denote cleaning of epoxy from the surface of the package, that is to say the injection-molded housing comprising a leadframe. Initial reflectivity of a metal refining finish of the leadframe may thus advantageously be maintained as a result. In particular, it is possible to maintain a good tightness of the package visa vis potting, molding and/or soldering materials.

The use of an injection-molding process thus advantageously affords the possibility of minimizing the footprint of the package, in particular of the LED package, or the possibility of using a larger semiconductor component while maintaining a predefined footprint.

This advantageously results in a lowering of costs for the carrier substrate used, which may be significant in particular for so-called "low-cost" applications, in which material costs comprise an increased proportion of the total costs.

Furthermore, an improvement in the quality of the substrate surface advantageously arises, which may lead to a higher aging resistance and/or a greater luminous efficiency.

Furthermore, a simplified production process sequence advantageously arises, with minimized risks for production engineering quality problems that occur. All this results from the use of an injection-molding process to produce or form the housing for the leadframe.

A thermally variable mold concept with the use of vacuum injection methods and/or dynamic mold closing force regulation may be provided for the injection-molding mold.

The injection-molding mold may comprise separate, active heating and/or cooling circuits that enable very fast heating (above Tg of the polymer) and/or cooling of the mold. This advantageously maintains the necessary viscosity during the injection process and/or for rapid and safe releasability from the mold.

To be able to completely fill the cavity structures via relatively few injection points (injection perforations), an injection time that is as short as possible is also provided (~0.1 s). This is achieved, for example, by a vacuum process and/or, for example, by a dynamic mold closing force regulation. Both methods provide for a stable injection-molding process at a relatively high injection pressure (avoidance of excess injections).

As a result, the following technical effects and advantages may thus advantageously be achieved:
Complete filling of extremely fine microstructures by relatively few injection points in conjunction with a very small gating height (a small gating height means that, owing to a small component height, only a low injection channel is available at the component, through which channel the thermoplastic may be introduced into the component mold.)
Avoidance of polymer degeneration
Safe release from the mold
Realization of short process times.

Four individual panels (sub-leadframes) may be connected to form one large panel (leadframe) by way of the injection-molding process.

Four individual panels are inserted into the mold and connected to form one panel by the injection-molding process, by way of the injection-molding material. This makes it possible to increase the number of injection points and significantly reduce the length of the flow paths to significantly facilitate complete filling of the cavities.

Warpage (panel warpage, that is to say warpage of the leadframe) may likewise be reduced because the stresses occurring as a result of a different CTE (CTE="coefficient of thermal expansion," i.e., the specific coefficient of thermal expansion for a material) of polymer and metal are reduced upon interruption of the metal structure.

This method also makes it possible for a polymer ring elevated from the leadframe plane to be drawn around the panel, the polymer ring enabling a simpler subsequent casting process (adhesive process).

A further advantage is that the use of coating metal may be minimized, specifically at the locations that would be coated in a larger panel, but in terms of their function would have to be used as stress relieving structures, and would therefore not be part of a package.

As a result, in particular the following technical advantages and effects may be achieved:
Complete filling of extremely fine microstructures by relatively few injection points in conjunction with a very small gating height
Avoidance of panel warpage
Realization of the smallest possible package design
Production of the highest possible package stability
Production of a casting frame (adhesive dam).

The design approach presented here includes, in particular, a balanced ratio of plastic/metal on the top side and underside of the embedded leadframe.

This leads to a balanced expansion behavior between leadframe top side and underside and thus to a reduction of warpage.

Controlling the size relationship between chip and leadframe is likewise achieved by the designs shown.

This is because the chip is seated, for example, centrally with respect to the cavity and no tolerance dimensions are required for excess injections possibly occurring (in EMC (Epoxy Mold Compound: epoxy molding material) to date 30 µm circumferentially during extrusion=>advantageous extension of the functional area upon bonding by 30 µm circumferentially may be achieved on account of the injection molding).

Although our carrier substrates, components, devices and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2015 113 438.1, the subject matter of which is incorporated herein by reference.

The invention claimed is:

1. A method of producing a carrier substrate for an optoelectronic semiconductor component comprising:
providing a leadframe comprising a first electrically conductive contact section and a second electrically conductive contact section, and
injection molding a housing comprising a housing frame embedding the leadframe by an injection-molding material free of epoxy such that the leadframe embedded in the housing frame of the injection-molded housing forms a carrier substrate for an optoelectronic semiconductor component, wherein the leadframe comprises a plurality of injection perforations in which injection-molding material is injected during the injection molding, and each of the plurality of injection perforations is a cutout extending from a top side of the leadframe to an underside of the leadframe, the underside being situated opposite the top side.

2. The method according to claim 1, wherein the leadframe is subdivided into a plurality of sub-leadframes, each comprising a first electrically conductive contact section and a second electrically conductive contact section such that, by the injection molding, the housing frame is formed with a plurality of sub-housing frames respectively embedding the plurality of sub-leadframes.

3. The method according to claim 1, wherein, by the injection molding, the housing frame is formed with a cavity, wherein the first contact section and the second contact section are arranged in a base region of the cavity.

4. The method according to claim 1, wherein injecting the injection-molding material comprises vacuum injection.

5. The method according to claim 1, wherein the injection-molding material is injected for a maximum of 1 s.

6. The method according to claim 1, wherein, before injecting the injection-molding material, the leadframe and/or an injection-molding mold in which the leadframe is arranged are and/or is respectively heated to a temperature greater than a temperature of the injected injection-molding material.

7. The method according to claim 1, wherein a closing force of an injection-molding mold in which the leadframe is arranged is increased during a process of injecting the injection-molding material.

8. The method according to claim 1, wherein the injection-molding material comprises a thermoplastic and/or a silicone.

9. The method according to claim 1, wherein the leadframe comprises a central beam section extending along an axis of symmetry of the leadframe, and the injection perforations are located in the central beam section.

10. A carrier substrate for an optoelectronic semiconductor component comprising:
a leadframe comprising a first electrically conductive contact section and a second electrically conductive contact section, and
a housing comprising a housing frame in which the leadframe is embedded,
wherein the housing is configured as a housing that is injection-molded from an injection-molding material, and the injection-molding material is free of epoxy, wherein the leadframe comprises a plurality of injection perforations filled by injection-molding material, and each of the plurality of injection perforations is a cutout extending from a top side of the leadframe to an underside of the leadframe, the underside being situated opposite the top side.

11. The carrier substrate according to claim 10, wherein the leadframe is subdivided into a plurality of sub-leadframes, each comprising a first electrically conductive contact section and a second electrically conductive contact section, and the housing frame comprises a plurality of sub-housing frames respectively embedding the plurality of sub-leadframes.

12. The carrier substrate according to claim 10, wherein the housing frame comprises a cavity, and the first contact section and the second contact section are arranged in a base region of the cavity.

13. The carrier substrate according to claim 10, wherein the injection-molding material comprises a thermoplastic and/or a silicone.

14. An optoelectronic lighting device comprising:
the carrier substrate according to claim 10, and
an optoelectronic semiconductor component arranged on one of either the first electrical contact section or the second electrical contact section, wherein an electrical connection is formed between the optoelectronic semiconductor component and the other of either the first electrical contact section and the second electrical contact section.

15. The carrier substrate according to claim 10, wherein the leadframe comprises a central beam section extending along an axis of symmetry of the leadframe, and the injection perforations are located in the central beam section.

16. A method of producing a carrier substrate for an optoelectronic semiconductor component comprising:
providing a leadframe comprising a first electrically conductive contact section and a second electrically conductive contact section,
wherein the leadframe is inserted into an opened injection-molding mold, the injection-molding mold comprises a mold lower part and a mold upper part, the mold lower part and the mold upper part each comprise one or a plurality of heating elements, and the mold lower part and the mold upper part are heated by the heating elements to a temperature greater than a temperature of an injection-molding material yet to be injected,
injection molding a housing comprising a housing frame embedding the leadframe by the injection-molding material free of epoxy such that the leadframe embedded in the housing frame of the injection-molded housing forms a carrier substrate for an optoelectronic semiconductor component,
wherein the mold lower part and the mold upper part each comprise a plurality of cooling channels, and
after injection of the injection-molding material, the heating elements are deactivated and the cooling channels are activated.

* * * * *